United States Patent

Wang

(10) Patent No.: US 11,697,168 B2
(45) Date of Patent: Jul. 11, 2023

(54) REFLOW OVEN WITH A CONTROLLABLY CONNECTED BLOCKED EXHAUST ZONE

(71) Applicant: ILLINOIS TOOL WORKS INC., Glenview, IL (US)

(72) Inventor: Yuwei Wang, Suzhou (CN)

(73) Assignee: ILLINOIS TOOL WORKS INC., Glenview, IL (US)

( * ) Notice: Subject to any disclaimer, the term of this patent is extended or adjusted under 35 U.S.C. 154(b) by 74 days.

(21) Appl. No.: 17/047,971

(22) PCT Filed: Apr. 18, 2019

(86) PCT No.: PCT/US2019/028148
§ 371 (c)(1),
(2) Date: Oct. 15, 2020

(87) PCT Pub. No.: WO2019/204623
PCT Pub. Date: Oct. 24, 2019

(65) Prior Publication Data
US 2021/0197304 A1    Jul. 1, 2021

(30) Foreign Application Priority Data

Apr. 20, 2018   (CN) .......................... 201810358009.8
May 23, 2018    (CN) .......................... 201810503435.6

(51) Int. Cl.
| | |
|---|---|
| B23K 3/04 | (2006.01) |
| B23K 1/008 | (2006.01) |
| H05K 3/34 | (2006.01) |
| B23K 101/42 | (2006.01) |
| B23K 3/08 | (2006.01) |

(52) U.S. Cl.
CPC .......... *B23K 1/008* (2013.01); *H05K 3/3494* (2013.01); *B23K 3/08* (2013.01); *B23K 2101/42* (2018.08);
(Continued)

(58) Field of Classification Search
None
See application file for complete search history.

(56) References Cited

U.S. PATENT DOCUMENTS 3,244,507 A * 4/1966 Linney .................. C22B 1/2413
266/178
5,345,061 A * 9/1994 Chanasyk .............. B23K 1/008
219/400

(Continued)

FOREIGN PATENT DOCUMENTS

| CN | 201895158 U | * | 7/2011 |
|---|---|---|---|
| CN | 206469670 U | | 9/2017 |

(Continued)

OTHER PUBLICATIONS

PCT International Search Report and Written Opinion for PCT Patent Application No. PCT/US2019/028148 dated Jul. 15, 2019, 10 pages.

*Primary Examiner* — Erin B Saad
*Assistant Examiner* — Carlos J Gamino
(74) *Attorney, Agent, or Firm* — McAndrews, Held & Malloy, Ltd.

(57) ABSTRACT

The present application discloses a reflow oven and the operation method thereof. The reflow oven can operate in air mode and inert gas mode. The reflow oven comprises a heating zone, a blocked exhaust zone and a cooling zone. The reflow oven further comprises a first pipeline, a second pipeline and a third pipeline. When the reflow oven operates in air mode, external clean air is delivered to the heating zone and is discharged from the heating zone and the blocked exhaust zone. When the reflow oven operates in inert gas mode, an inert gas is delivered from the blocked exhaust zone to the heating zone and is discharged from the heating zone. Satisfying the accurate temperature profiling necessary for reflow processing in the operation atmosphere (Continued)

of air or an inert gas, the reflow oven in the present application can effectively discharge volatile pollutants to reduce the number of follow-up services and maintenances. In addition, the reflow oven in the present application can save the expensive inert gas.

11 Claims, 4 Drawing Sheets

(52) U.S. Cl.
CPC .......................... *H05K 2203/111* (2013.01); *H05K 2203/1121* (2013.01)

(56) References Cited

U.S. PATENT DOCUMENTS

| | | | | |
|---|---|---|---|---|
| 5,440,101 | A * | 8/1995 | Cox | ..................... H05K 13/02 34/212 |
| 5,579,981 | A * | 12/1996 | Matsumura | ............ B23K 1/008 228/19 |
| 6,146,448 | A * | 11/2000 | Shaw | .................... B23K 1/008 55/467 |
| 10,576,567 | B2 * | 3/2020 | Diepstraten | .............. B23K 3/08 |
| 2003/0205037 | A1 | 11/2003 | Mullins | |
| 2003/0218058 | A1 * | 11/2003 | Shaw | .................... B23K 1/012 228/230 |
| 2009/0324454 | A1 * | 12/2009 | Nakano | ............. B01D 53/8668 502/64 |
| 2014/0209662 | A1 * | 7/2014 | Ngai | ..................... F27D 1/1678 134/4 |
| 2021/0170514 | A1 * | 6/2021 | Wang | ..................... B23K 1/008 |
| 2021/0180867 | A1 * | 6/2021 | Wang | ..................... F27D 21/04 |
| 2021/0339330 | A1 * | 11/2021 | Yan | ...................... B23K 1/0016 |

FOREIGN PATENT DOCUMENTS

| | | |
|---|---|---|
| EP | 0307319 A2 | 3/1989 |
| EP | 1702705 A1 | 9/2006 |
| JP | 2008279502 A * | 11/2008 |

* cited by examiner

REFLOW OVEN WITH A CONTROLLABLY CONNECTED BLOCKED EXHAUST ZONE

CROSS-REFERENCE TO RELATED APPLICATIONS

The present application is a national stage application under 35 U.S.C. § 371 of application Serial No. PCT/US2019/028148, filed on Apr. 18, 2019, and entitled "REFLOW OVEN AND OPERATION METHOD THEREOF." The aforementioned application is hereby incorporated herein by reference in its entirety.

TECHNICAL FIELD

The present application generally relates to a reflow oven and the operation method thereof, and in particular relates to the improvements of gas intake and gas discharge of the reflow oven.

BACKGROUND ART

In the manufacturing of printed circuit boards (PCBs), electronic components are usually mounted on PCBs through reflow soldering techniques. In a typical reflow soldering process, solder paste is deposited in a designated area on a PCB and the leads of one or more electronic components are inserted into said deposited solder paste. Then the PCB passes through a reflow oven. The solder paste reflows (namely, is heated to the melting or reflow temperature) in the heating zone in the reflow oven, and is then cooled in the cooling zone so that the leads of the electronic components are electrically and mechanically connected to the PCB. The term "PCB" used here includes the substrate assembly of any type of electronic component, for example wafer substrate.

Typically, solder paste includes not only the solder, but also the soldering flux which moistens the solder and provides a good solder joint. Solder paste can also include other additives such as solvents and catalysts. After solder paste is deposited on the PCB, the PCB is transferred by a conveyor to pass through a plurality of heating zones in the reflow oven. The heat in the heating zones melts the solder paste and vaporizes the volatile organic compounds (VOCs) in the soldering flux and other additives in the solder paste to form vapors. These vapors are called "volatile pollutants" below.

The accumulation of these volatile pollutants in the reflow oven will lead to some problems. If volatile pollutants reach the cooling zone, they will condense on the PCB to pollute the PCB, and thus a follow-up cleaning step is required. Volatile pollutants will also condense on the surface of the cooler of the reflow oven to block air holes. The condensate may also drop on the following PCBs, which can destroy them or make it necessary to perform a follow-up cleaning step.

In the reflow oven, air or an inert gas (for example, nitrogen) is usually used as an operation atmosphere, and the PCB requires different operation atmospheres for different process requirements. The chamber of the reflow oven is filled with an operation atmosphere and soldering is performed when the PCB is transferred by a conveyor to pass through the chamber. For the reflow oven where air is used as an operation atmosphere, fresh air is introduced from the two ends of the oven and the air and volatile pollutants are discharged from the internal zone of the reflow oven. For the reflow oven where an inert gas is used as an operation atmosphere, since inert gases are expensive, the cost effectiveness of the inert gas to be used should be considered for the treatment of volatile pollutants. For the reflow oven where the operation atmosphere can be switched between air and inert gases, the PCB needs to pass through a set of systems to meet the requirements for the treatment of volatile pollutants in these two different operation atmospheres. In addition, the accurate temperature profiling necessary for reflow processing should also be satisfied during the treatment of volatile pollutants.

SUMMARY OF THE DISCLOSURE

The object of the present application is to provide a reflow oven, which can effectively discharge volatile pollutants to reduce the number of follow-up services and maintenances and can also save the expensive inert gas, with the accurate temperature profiling necessary for reflow processing in the operation atmosphere of air or an inert gas satisfied.

According to the first aspect of the present application, the present application provides a reflow oven, said reflow oven is able to operate in air mode and in inert gas mode, and said reflow oven comprises a heating zone; said heating zone having a plurality of heating zone inlets and a plurality of heating zone outlets, a cooling zone; a blocked exhaust zone, said blocked exhaust zone being located between said heating zone and said cooling zone, and said heating zone, said blocked exhaust zone and said cooling zone being fluid-connected and said blocked exhaust zone having a blocked exhaust zone outlet; a first pipeline, said first pipeline being controllably connected to said blocked exhaust zone outlet and said first pipeline being able to be connected to the ambient environment; a second pipeline and a plurality of outlet branch pipelines, said second pipeline being able to be connected to the ambient environment, said plurality of outlet branch pipelines being connected between said plurality of heating zone outlets and said second pipeline, said plurality of outlet branch pipelines being able to connect said plurality of heating zone outlets and said second pipeline, wherein some or all outlet branch pipes of said plurality of outlet branch pipelines controllably connect said plurality of heating zone outlets and said second pipeline; a third pipeline and a plurality of inlet branch pipelines, said plurality of inlet branch pipelines being connected between said plurality of heating zone inlets and said third pipeline, said plurality of inlet branch pipelines being able to connect said plurality of heating zone inlets and said third pipeline, said third pipeline being controllably connected to said blocked exhaust zone outlet and said third pipeline being controllably connected to the ambient environment so that said plurality of inlet branch pipelines can controllably connect said plurality of heating zone inlets to the ambient environment, and in addition, said plurality of inlet branch pipelines being able to controllably connect said plurality of heating zone inlets and said blocked exhaust zone outlet.

According to the abovementioned reflow oven, at least one outlet branch pipeline of said plurality of outlet branch pipelines directly connects at least one heating zone outlet of said plurality of heating zone outlets and said second pipeline, and the other outlet branch pipelines of said plurality of outlet branch pipelines controllably connect the corresponding heating zone outlets of said plurality of heating zone outlets and said second pipeline.

According to the reflow oven, all outlet branch pipelines of said plurality of outlet branch pipelines controllably connect said plurality of heating zone outlets and said second pipeline.

According to the reflow oven, said first pipeline and said third pipeline are controllably connected to said blocked exhaust zone outlet through a first valve gear, some or all outlet branch pipelines of said plurality of outlet branch pipelines controllably connect said plurality of heating zone outlets and said second pipeline through second valve gears, respectively, and said third pipeline is controllably connected to the ambient environment through a third valve gear.

According to the reflow oven, said first pipeline and said third pipeline are controllably connected to said blocked exhaust zone outlet through a first valve gear, the other outlet branch pipelines of said plurality of outlet branch pipelines controllably connect the corresponding heating zone outlets of said plurality of heating zone outlets and said second pipeline through second valve gears, respectively, and said third pipeline is controllably connected to the ambient environment through a third valve gear, wherein, in said air mode, said first valve gear connects said first pipeline and said blocked exhaust zone outlet and disconnects said third pipeline from said blocked exhaust zone outlet so that the gas in said blocked exhaust zone can be discharged to the ambient environment through said first pipeline, said second valve gear connects the other outlet branch pipelines of said plurality of outlet branch pipelines and the corresponding heating zone outlets of said plurality of heating zone outlets so that the gas in said heating zone can enter said second pipeline and be discharged to the ambient environment through said plurality of outlet branch pipelines, and said third valve gear connects said third pipeline to the ambient environment so that external clean air can enter said heating zone through said third pipeline, and in inert gas mode, said first valve gear disconnects said first pipeline from said blocked exhaust zone outlet and connects said third pipeline and said blocked exhaust zone outlet so that the gas in said blocked exhaust zone can enter said third pipeline, said second valve gear disconnects the other outlet branch pipelines of said plurality of outlet branch pipelines from the corresponding heating zone outlets of said plurality of heating zone outlets so that the gas in said heating zone can enter said second pipeline and be discharged from said second pipeline to the ambient environment through said at least one outlet branch pipeline directly connecting said at least one heating zone outlet of said plurality of heating zone outlets and said second pipeline, and said third valve gear disconnects said third pipeline from the ambient environment so that the gas entering said third pipeline from said blocked exhaust zone can enter said heating zone.

According to the reflow oven, said first pipeline and said third pipeline are controllably connected to said blocked exhaust zone outlet through a first valve gear, all outlet branch pipelines of said plurality of outlet branch pipelines controllably connect said plurality of heating zone outlets and said second pipeline through second valve gears, respectively, and said third pipeline is controllably connected to the ambient environment through a third valve gear, wherein, in said air mode, said first valve gear connects said first pipeline and said blocked exhaust zone outlet and disconnects said third pipeline from said blocked exhaust zone outlet so that the gas in said blocked exhaust zone can be discharged to the ambient environment through said first pipeline, said second valve gear connects all outlet branch pipelines of said plurality of outlet branch pipelines and said plurality of heating zone outlets so that the gas in said heating zone can enter said second pipeline and be discharged to the ambient environment through said plurality of outlet branch pipelines, and said third valve gear connects said third pipeline to the ambient environment so that external clean air can enter said heating zone through said third pipeline, and in inert gas mode, said first valve gear disconnects said first pipeline from said blocked exhaust zone outlet and connects said third pipeline and said blocked exhaust zone outlet so that the gas in said blocked exhaust zone can enter said third pipeline, said second valve gear connects at least one outlet branch pipeline of said plurality of outlet branch pipelines and a corresponding heating zone outlet of said plurality of heating zone outlets and disconnects the other outlet branch pipelines of said plurality of outlet branch pipelines from the corresponding heating zone outlet of said plurality of heating zone outlets so that the gas in said heating zone can enter said second pipeline and be discharged from said second pipeline to the ambient environment through said at least one outlet branch pipeline, and said third valve gear disconnects said third pipeline from the ambient environment so that the gas entering said third pipeline from said blocked exhaust zone can enter said heating zone.

According to the reflow oven, said heating zone comprises at least one preheating sub-zone, at least one uniform-temperature sub-zone and at least one peak-value sub-zone, wherein said plurality of heating zone inlets are arranged in said at least one preheating sub-zone and said at least one uniform-temperature sub-zone so that the gas entering said third pipeline can enter said at least one preheating sub-zone and said at least one uniform-temperature sub-zone.

According to the reflow oven, said heating zone comprises at least one preheating sub-zone, at least one uniform-temperature sub-zone and at least one peak-value sub-zone, wherein said plurality of heating zone outlets are arranged in said at least one preheating sub-zone, said at least one uniform-temperature sub-zone and said at least one peak-value sub-zone, and in addition, the gas in said heating zone enters said second pipeline and is discharged from said second pipeline to the ambient environment through the heating zone outlets arranged in said at least one peak-value sub-zone in said inert gas mode.

According to the reflow oven, a first gas accelerator and a second gas accelerator are arranged on said first pipeline and said third pipeline, respectively, wherein said first gas accelerator and said second gas accelerator are arranged near said blocked exhaust zone to accelerate gas discharging from said blocked exhaust zone.

According to the reflow oven, said first valve gear comprises an inlet, a first outlet and a second outlet, wherein said inlet is connected to said blocked exhaust zone outlet, said first outlet is connected to said first pipeline, and said second outlet is connected to said third pipeline so that the connections/disconnections of said first pipeline and said third pipeline with/from said blocked exhaust zone outlet can be controlled by controlling the connection/disconnection of said inlet with/from said first outlet and the connection/disconnection of said inlet with/from said second outlet.

According to the second aspect of the present application, the present application provides a method for operating the reflow oven, said reflow oven comprising a heating zone, a cooling zone and a blocked exhaust zone which are fluid-connected, said blocked exhaust zone being located between said heating zone and said cooling zone, said reflow oven being able to operate in air mode and in inert gas mode, said method comprising: delivering external clean air to said heating zone and discharging gas from said heating zone and said blocked exhaust zone when said reflow oven operates in said air mode, and delivering gas from said blocked exhaust zone to said heating zone and discharging gas from said heating zone when said reflow oven operates in said inert gas mode.

According to the method, in said air mode, gas is discharged from a plurality of sub-zones of said heating zone, and external clean air is delivered to the sub-zones of said heating zone which are remote from said blocked exhaust zone.

According to the method, in said inert gas mode, gas is delivered from said blocked exhaust zone to the sub-zones of said heating zone which are remote from said blocked exhaust zone, and gas is discharged from the sub-zones of said heating zone which are near said blocked exhaust zone.

According to the method, said sub-zones remote from said blocked exhaust zone include at least one preheating sub-zone and at least one uniform-temperature sub-zone, and said sub-zones near said blocked exhaust zone include at least one peak-value sub-zone.

According to the method, a gas accelerator is arranged on said first pipeline near said blocked exhaust zone and/or said third pipeline near said blocked exhaust zone to accelerate gas discharging from said blocked exhaust zone.

BRIEF DESCRIPTION OF THE DRAWINGS

The following detailed description in combination with the drawings will better explain the reflow oven and the operation method. In the drawings, the same reference numerals represent the same parts.

DETAILED DESCRIPTION

Figure 1A:
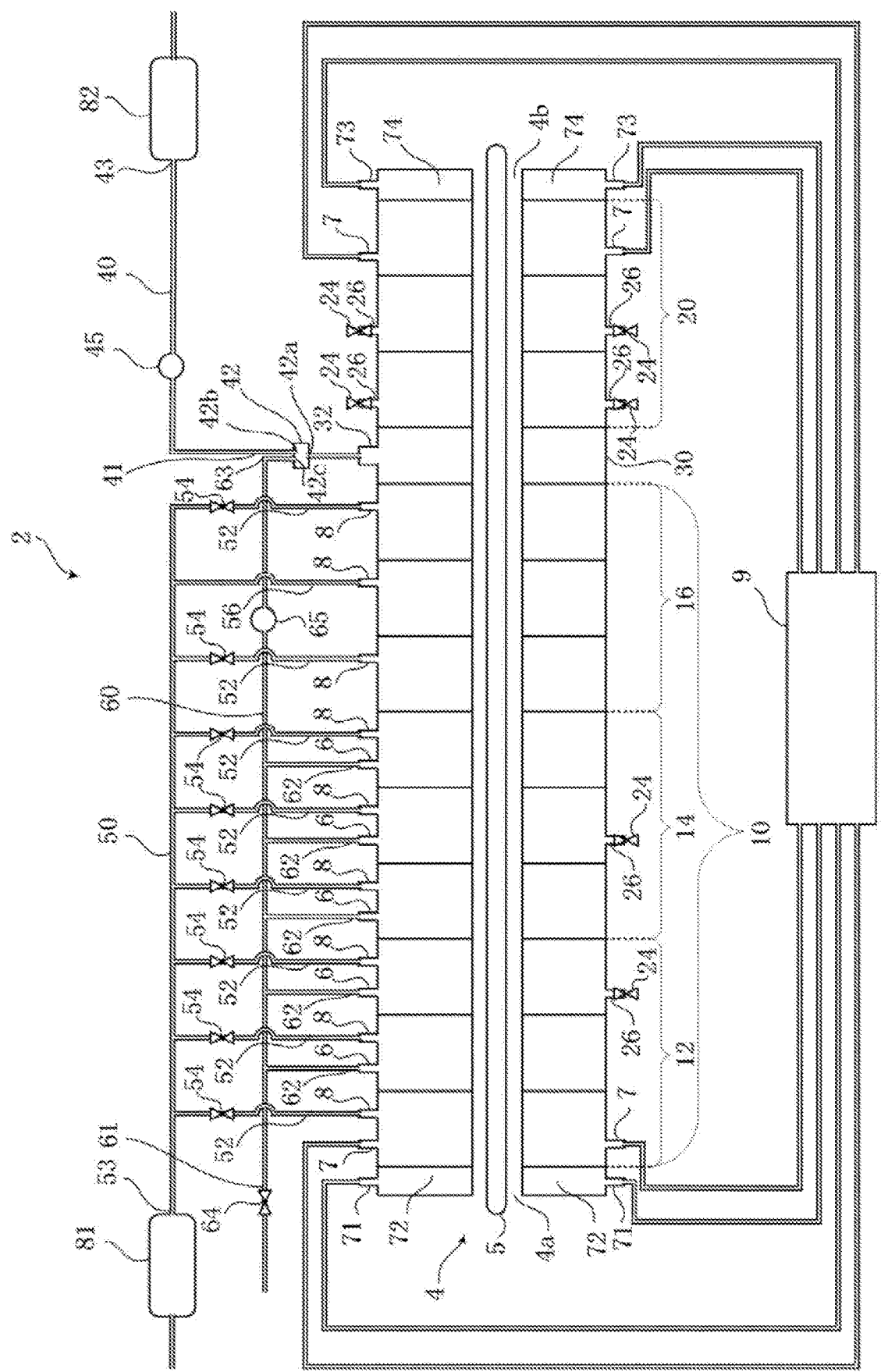
FIG. 1A is a simplified schematic diagram for one embodiment of the reflow oven in the present application.

The following will describe various specific implementation modes of the present application by reference to the drawings which constitute a part of the present description. It should be understood that although the terms indicating directions, such as "front", "rear", "on", "below", "left", "right", "inside", "outside", "top", and "bottom" are used to describe various exemplified structural parts and components in the present application, these terms are merely used for the convenience of illustrations and are determined based on the exemplified directions in the drawings. Since the embodiments disclosed in the present application can be set in different directions, these terms indicating directions are only used as illustrations, instead of restrictions. Where possible, the same or similar reference numerals used in the present application refer to the same components.

FIG. 1A is a simplified schematic diagram for one embodiment of the reflow oven 2 in the present application. The reflow oven 2 can serve as an air/inert gas switchable reflow oven where the operation atmosphere can be not only air, but also an inert gas, and thus, the reflow oven 2 can not only operate in air mode, but can also operate in inert gas mode. Said inert gas can be nitrogen, for example. The following will describe the reflow oven 2 using nitrogen as an inert gas in the present application. It should be noted that the inert gas which can be used by the reflow oven 2 in the present application is not limited to nitrogen, but can be any inert gas.

As shown in FIG. 1A, the reflow oven 2 comprises a chamber 4, a heating zone 10 and a cooling zone 20. A blocked exhaust zone 30 is arranged between the heating zone 10 and the cooling zone 20. The chamber 4 passes through the heating zone 10, the cooling zone 20 and the blocked exhaust zone 30, and the heating zone 10, the cooling zone 20 and the blocked exhaust zone 30 are fluid-connected through the chamber 4. In addition, the heating zone 10, the cooling zone 20 and the blocked exhaust zone 30 are also fluid-connected with the chamber 4. Each of the heating zone 10, the cooling zone 20 and the blocked exhaust zone 30 comprises the portions located above and below the chamber 4. A heating component (not shown) used to heat a PCB is arranged in the heating zone 10, and a cooling component (not shown) used to cool a PCB is arranged in the cooling zone 20. The chamber 4 comprises an inlet 4a and an outlet 4b. The reflow oven 2 is further equipped with a conveyor 5 and the conveyor 5 passing through the chamber 4 is used to transfer the PCB to be treated into the chamber 4 through the inlet 4a of the chamber 4 and output the PCB treated by the reflow oven 2 from the chamber 4 through the outlet 4b of the chamber 4. It should be noted that FIG. 1 is a side view of the reflow oven 2, with the housing used to cover the front and rear sides of the chamber 4 removed in FIG. 1 for the convenience of the description of the reflow oven 2.

The heating zone 10 and the cooling zone 20 can comprise a plurality of sub-zones, respectively. In the embodiment shown in FIG. 1A, the heating zone 10 comprises nine sub-zones and said nine sub-zones include three preheating sub-zones 12, three uniform-temperature sub-zones 14 and three peak-value sub-zones 16. The preheating sub-zones 12, uniform-temperature sub-zones 14 and peak-value sub-zones 16 are continuously joined and the temperature gradually increases. In the preheating sub-zones 12 and the uniform-temperature sub-zones 14, a PCB is heated and a part of VOCs in the soldering flux in the solder paste distributed on the PCB is vaporized. The peak-value sub-zones 16 are hotter than the preheating sub-zones 12 and the uniform-temperature sub-zones 14, and solder paste melts in the peak-value sub-zones 16. The peak-value sub-zones 16 are also the sub-zones where hotter VOCs (for example, rosin and resin) will be vaporized. The cooling zone 20 comprises three sub-zones. After the PCB is transferred from the heating zone 10 to the cooling zone 20, solder paste is cooled to solidify in the solder area of the PCB, and thus, electronic components are connected to the PCB. It should be noted that the numbers of sub-zones of the heating zone 10 and the cooling zone 20 of the reflow oven, and the numbers of preheating sub-zones 12, uniform-temperature sub-zones 14 and peak-value sub-zones 16 can vary with the products to be soldered, but are not limited to the embodiment shown in FIG. 1A. For example, in another embodiment, the reflow oven can have fourteen sub-zones for a type of PCB, including three preheating sub-zones, four uniform-temperature sub-zones, three peak-value sub-zones and four sub-zones of the cooling zone.

Still as shown in FIG. 1A, each sub-zone of the nine sub-zones (namely, three preheating sub-zones 12, three uniform-temperature sub-zones 14 and three peak-value sub-zones 16) of the heating zone 10 is equipped with a heating zone outlet 8. Except the preheating sub-zone near the inlet 42 of the chamber and the three peak-value sub-zones 16, each of the three uniform-temperature sub-zones 14 and the other two preheating sub-zones 12 is equipped with a heating zone inlet 6. It should be noted that each preheating sub-zone 12 and each uniform-temperature sub-zone 14 can also be equipped with a heating zone inlet 6. Such a configuration will also fall within the scope of protection of the present application.

A blocked exhaust zone 30 is arranged between the heating zone 10 and the cooling zone 20. The blocked exhaust zone 30 discharges gas from the chamber 4, thus blocking the gas coming from the heating zone 10 and containing volatile pollutants from entering the cooling zone 20 or reducing the amount of the gas entering the cooling zone. In addition, by discharging gas from the chamber 4, the blocked exhaust zone 30 can also serve as a temperature isolation zone to isolate the high-temperature heating zone 10 from the low-temperature cooling zone 20. For this purpose, the blocked exhaust zone 30 is equipped with a blocked exhaust zone outlet 32.

The reflow oven 2 comprises a first pipeline 40 and the first pipeline 40 can discharge gas from the blocked exhaust zone 30 of the reflow oven 2 in air mode. The first pipeline 40 comprises a first pipeline inlet 41 and a first pipeline outlet 43, the first pipeline inlet 41 is connected to the blocked exhaust zone outlet 32 through a first valve gear 42, and the first pipeline outlet 43 is connected to the ambient environment. By controlling the first valve gear 42, the first pipeline 40 can be connected with or disconnected from the blocked exhaust zone outlet 32, and thus the first pipeline 40 can controllably be connected with the blocked exhaust zone outlet 32. According to one example of the present application, the first pipeline outlet 43 is connected to a filtering device 82, and the gas discharged from the first pipeline 40 is discharged to the ambient environment after volatile pollutants are filtered out by the filtering device 82.

The reflow oven 2 further comprises a second pipeline 50 and a plurality of outlet branch pipelines 52, 56, and gas can be discharged from the heating zone 10 of the reflow oven 2. The second pipeline 50 comprises a second pipeline outlet 53, and the number of the plurality of outlet branch pipelines 52, 56 corresponds to the number of the heating zone outlets 8. Each outlet branch pipeline 52, 56 is connected to a corresponding heating zone outlet 8, and the second pipeline outlet 53 is connected to the ambient environment. By controlling the connection/disconnection of each outlet branch pipelines 52, 56 with/from the corresponding heating zone outlet 8, the gas in the heating zone 10 can be introduced into the second pipeline 50 through one or more of the plurality of outlet branch pipelines 52, 56 and can be discharged from the second pipeline outlet 53. According to one example of the present application, the second pipeline outlet 53 is connected to a filtering device 81, and the gas discharged from the second pipeline 50 is discharged to the ambient environment after volatile pollutants are filtered out by the filtering device 81.

In the example shown in FIG. 1A, except the middle peak-value sub-zone 16 of the three peak-value sub-zones 16, the corresponding outlet branch pipeline 52 connected to the heating zone outlet 8 of each of the other sub-zones of the heating zone is equipped with a second valve gear 54. More particularly, one outlet branch pipeline 56 of the plurality of outlet branch pipelines 52, 56 is directly connected with the heating zone outlet 8 of the middle peak-value sub-zone 16, the other outlet branch pipelines 52 of the plurality of outlet branch pipelines 52, 56 are equipped with a second valve gear 54, and thus these outlet branch pipelines 52 controllably connect the corresponding heating zone outlets 8 with the second pipeline 50. By controlling the opening and closing of the second valve gears 54, the corresponding heating zone outlets 8 can be connected with or disconnected from the second pipeline 50, and thus, the outlet branch pipelines 52 can controllably connect the corresponding heating zone outlets 8 with the second pipeline 50. This setting is because the requirements for gas discharging by use of the second pipeline 50 in two operation modes of the reflow oven 2 are different. In the example shown in FIG. 1A, in air mode, gas can be discharged from each sub-zone of the heating zone through the second pipeline 50, and in nitrogen mode, gas can be discharged only from the middle peak-value sub-zone 16 of the three peak-value sub-zones 16 though the second pipeline 50. It can be seen that in these two modes gas will be discharged from the middle peak-value sub-zone 16 of the three peak-value sub-zones 16 through the second pipeline 50. Thus, the heating zone outlet 8 of the middle peak-value sub-zone 16 is always connected with the corresponding outlet branch pipeline 56 and does not need to be disconnected. The second valve gear 54 in FIG. 1A is equipped to realize the requirement for gas discharging by use of the second pipeline 50. Of course, a second valve gear 54 can also be arranged on the corresponding outlet branch pipeline 56 of the heating zone outlet 8 of the middle peak-value sub-zone 16, as long as the valve gear is always kept on. In other examples, there are different valve gear setting modes according to different requirements for gas discharging by use of the second pipeline 50, as long as each sub-zone of the heating zone can be connected with the second pipeline 50 when the second pipeline 50 needs to be used for gas discharging, and can be disconnected from the second pipeline 50 when the second pipeline 50 does not need to be used for gas discharging. In some embodiments, a second valve gear 54 can also be arranged at the two ends of an outlet branch pipeline 52, but not on the corresponding outlet branch pipeline 52, as long as the outlet branch pipeline 52 can controllably connect the corresponding heating zone outlet 8 with the second pipeline 50.

The reflow oven 2 further comprises a third pipeline 60 and a plurality of inlet branch pipelines 62, and they are used to transfer clean air to the chamber 4 in air mode and are used to discharge gas from the blocked exhaust zone 30 of the reflow oven 2 and then transfer gas to the low-temperature preheating sub-zones 12 and the uniform-temperature zones 16 in nitrogen mode. The third pipeline 60 comprises a first inlet 61 and a second inlet 63. The number of the plurality of inlet branch pipelines 62 corresponds to the number of the heating zone inlets 6, and each inlet branch pipeline 62 is connected to a corresponding heating zone inlet 6 and can be connected with it. The first inlet 61 of the third pipeline 60 is connected with the ambient environment through a third valve gear 64. By controlling the opening and closing of the third valve gear 64, the third pipeline 60 can be connected with or disconnected from the ambient environment, and thus, the third pipeline 60 can controllably be connected with the ambient environment. The second inlet 63 of the third pipeline is connected to the blocked exhaust zone outlet 32 through the first valve gear 42. By controlling the first valve gear 42, the third pipeline 60 can be connected with or disconnected from the blocked exhaust zone outlet 32, and thus the third pipeline 60 can controllably be connected with the blocked exhaust zone outlet 32.

In some embodiments, the first valve gear 42 can comprise two separate valves, which are respectively used to controllably connect the first pipeline 40 and the third pipeline 60 with the blocked exhaust zone outlet 32. In the embodiment shown in FIG. 1A, the first valve gear 42 is a valve (for example, a three-way valve), and for this reason, said first valve gear 42 comprises an inlet 42*a*, a first outlet 42*b* and a second outlet 42*c*. The inlet 42*a* is connected to the blocked exhaust zone outlet 32, and the first outlet 42*b* and the second outlet 42*c* are respectively connected to the inlet 41 of the first pipeline 40 and the second inlet 63 of the third pipeline 60. By controlling the first valve gear 42, the connection of the inlet 42*a* with the first outlet 42*b* and the disconnection of the inlet from the second outlet 42*c* can be controlled, and thus the first pipeline 40 is connected with the blocked exhaust zone outlet 32 and the third pipeline 60 is disconnected from the blocked exhaust zone outlet 32. Or, by controlling the disconnection and connection of the inlet 42*a* from the first outlet 42*b* and with the second outlet 42*c*, the first pipeline 40 is disconnected from the blocked exhaust zone outlet 32 and the third pipeline 60 is connected with the blocked exhaust zone outlet 32.

The reflow oven 2 further comprises an inlet blocked zone 72 located at the inlet 4*a* of the chamber and an outlet blocked zone 74 located at the outlet 4*b* of the chamber. The inlet blocked zone 72 and the outlet blocked zone 74 are used to supply nitrogen to the chamber 4 to form a nitrogen curtain in nitrogen mode. The nitrogen curtain can block external air from entering the chamber 4, thus keeping clean the nitrogen operation atmosphere in the reflow oven 2. For this purpose, a nitrogen inlet 71, 73 is arranged on the inlet blocked zone 72 and the outlet blocked zone 74, respectively. The nitrogen inlets 71, 73 are respectively connected to a nitrogen supply source 9 to supply clean nitrogen to the inlet blocked zone 72 and the outlet blocked zone 74.

Still as shown in FIG. 1A, a nitrogen inlet 7 is arranged in the preheating sub-zone 12 near the inlet 4*a* of the chamber and the cooling zone 16 near the outlet 4*b* of the chamber, and the nitrogen inlets 7 are connected to a nitrogen supply source 9 to supply clean nitrogen to the reflow oven 2 when the reflow oven 2 operates in nitrogen mode. In each sub-zone of the heating zone 10 of the reflow oven 2, the temperature of the gas in the chamber 4 gradually increases from left to right, and different zones in the chamber 4 have different temperatures to meet the temperature requirements for PCB processing. Supplying clean nitrogen from near the inlet 4*a* of the chamber to the reflow oven 2 enables normal-temperature clean nitrogen to enter the lowest-temperature sub-zones of the heating zone, thus avoiding significantly influencing the temperature of the gas in the higher-temperature sub-zones of the heating zone. When the reflow oven 2 operates in nitrogen mode, since gas is discharged from the blocked exhaust zone 30 and gas is heated in the heating zone 10, as far as the whole chamber 4 is concerned, the pressure in the middle of the chamber 4 is lower than the pressure at the inlet 4*a* of the chamber or at the outlet 4*b* of the chamber. Thus, when clean nitrogen is supplied from near the inlet 4*a* of the chamber and the outlet 4*b* of the chamber to the reflow oven 2, nitrogen is easier to enter the chamber 4 under the action of the pressure. In addition, when clean nitrogen is supplied from the cooling zone 20 near the outlet 4*b* of the chamber to the reflow oven 2, the flowing of clean nitrogen towards the preheating sub-zone 12 can block the hot gas containing volatile pollutants in the heating zone 10 from entering the cooling zone 20, thus preventing the condensates of hot vapors in the cooling zone 20 from affecting a PCB or the components in the cooling zone 20.

The reflow oven 2 further comprises a first gas accelerator 45 on the first pipeline 40 and a second gas accelerator 65 on the third pipeline 60. The first gas accelerator 45 and the second gas accelerator 65 are arranged near the blocked exhaust zone outlet 32 and are used to accelerate gas discharging from the blocked exhaust zone outlet 32. According to one example of the present application, the first gas accelerator 45 and the second gas accelerator 65 are Venturi pipes. The first gas accelerator 45 and the second gas accelerator 65 can accelerate gas discharging from the blocked exhaust zone outlet 32, then further blocking hot gas containing volatile pollutants in the heating zone 10 from entering the cooling zone 20.

In some embodiments, the first pipeline 40, the second pipeline 50 and the third pipeline 60 and the branch pipelines are all made of square pipes for the convenience of the installation of various control valves.

Still as shown in FIG. 1A, the reflow oven 2 is further equipped with a plurality of auxiliary inlets 26, which are used to supply clean air to the reflow oven 2 when the reflow oven 2 operates in air mode. The auxiliary inlets 26 can be arranged in the preheating sub-zones 12 and/or uniform-temperature sub-zones 14 of the heating zone 10. The auxiliary inlets 26 can also be arranged in the cooling zone 20. The auxiliary inlets 26 can be arranged at the top or bottom of the sub-zones. Each auxiliary inlet 26 is equipped with an auxiliary inlet control valve 24, which is used to open the auxiliary inlet 26 in air mode and close the auxiliary inlet 26 in nitrogen mode. The auxiliary inlets 26 can further accelerate the gas circulation in the reflow oven 2 in air mode.

Figure 1B:
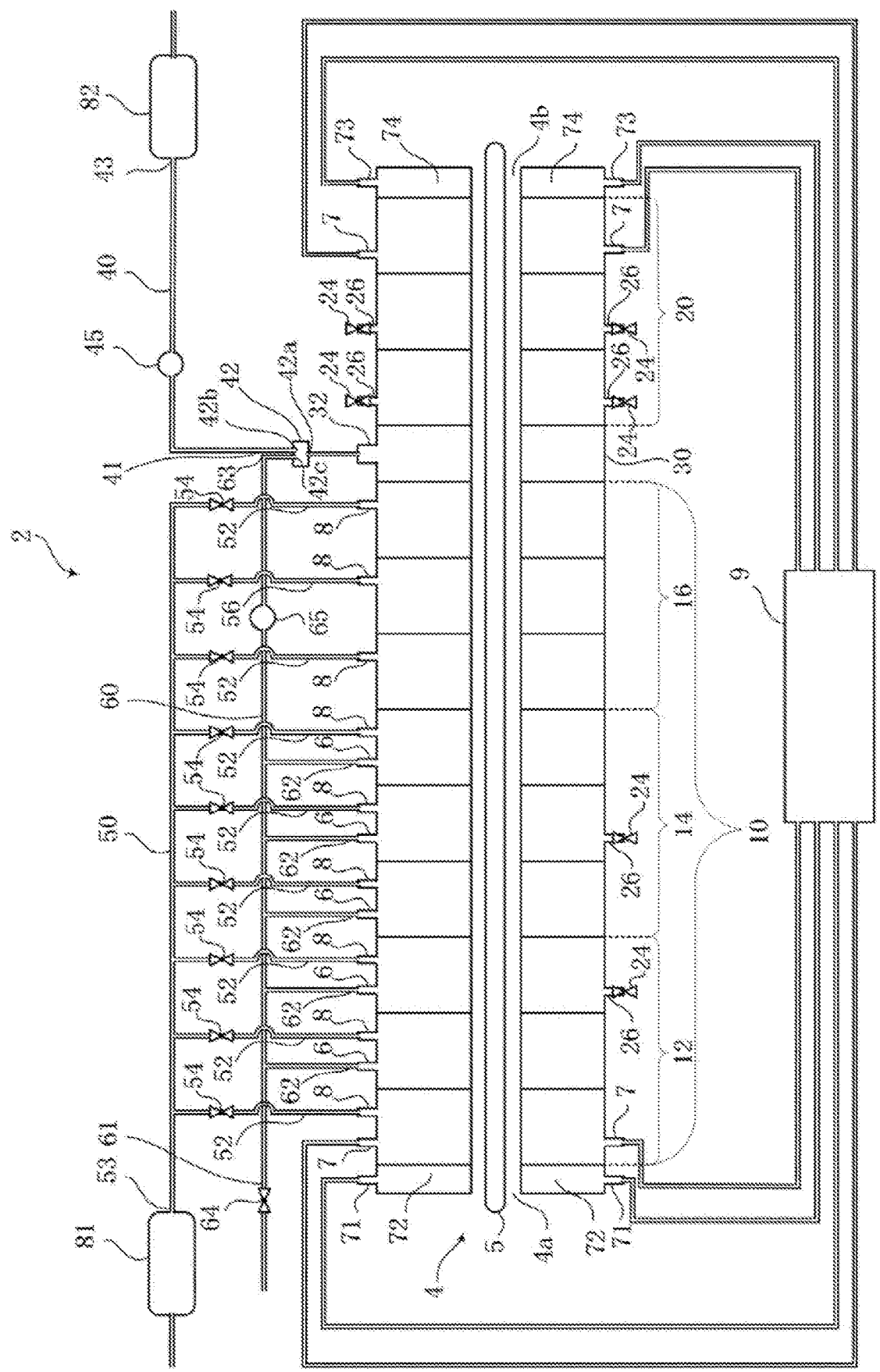
FIG. 1B is a simplified schematic diagram for another embodiment of the reflow oven in the present application.

FIG. 1B is a schematic diagram for another embodiment of the reflow oven 2 in the present application. The embodiment shown in FIG. 1B is similar to the embodiment shown in FIG. 1A, and the difference is that: in the embodiment in FIG. 1A, one outlet branch pipeline 56 of the plurality of outlet branch pipelines 52, 56 is directly connected with the heating zone outlet 8 of the middle peak-value sub-zone 16, and the other outlet branch pipelines 52 are controllably connected with the other heating zone outlets 8 through second valve gears 54, while in the embodiment in FIG. 1B, all outlet branch pipelines 52, 56 of the plurality of outlet branch pipelines 52, 56 are controllably connected with the corresponding heating zone outlets 8 through second valve gears 54. By controlling the opening and closing of the second valve gears 54, the heating zone outlets 8 can be connected with or disconnected from the corresponding outlet branch pipelines 52, 56, and thus the outlet branch pipelines 52, 56 can controllably be connected with the heating zone outlets 8.

Figure 2:
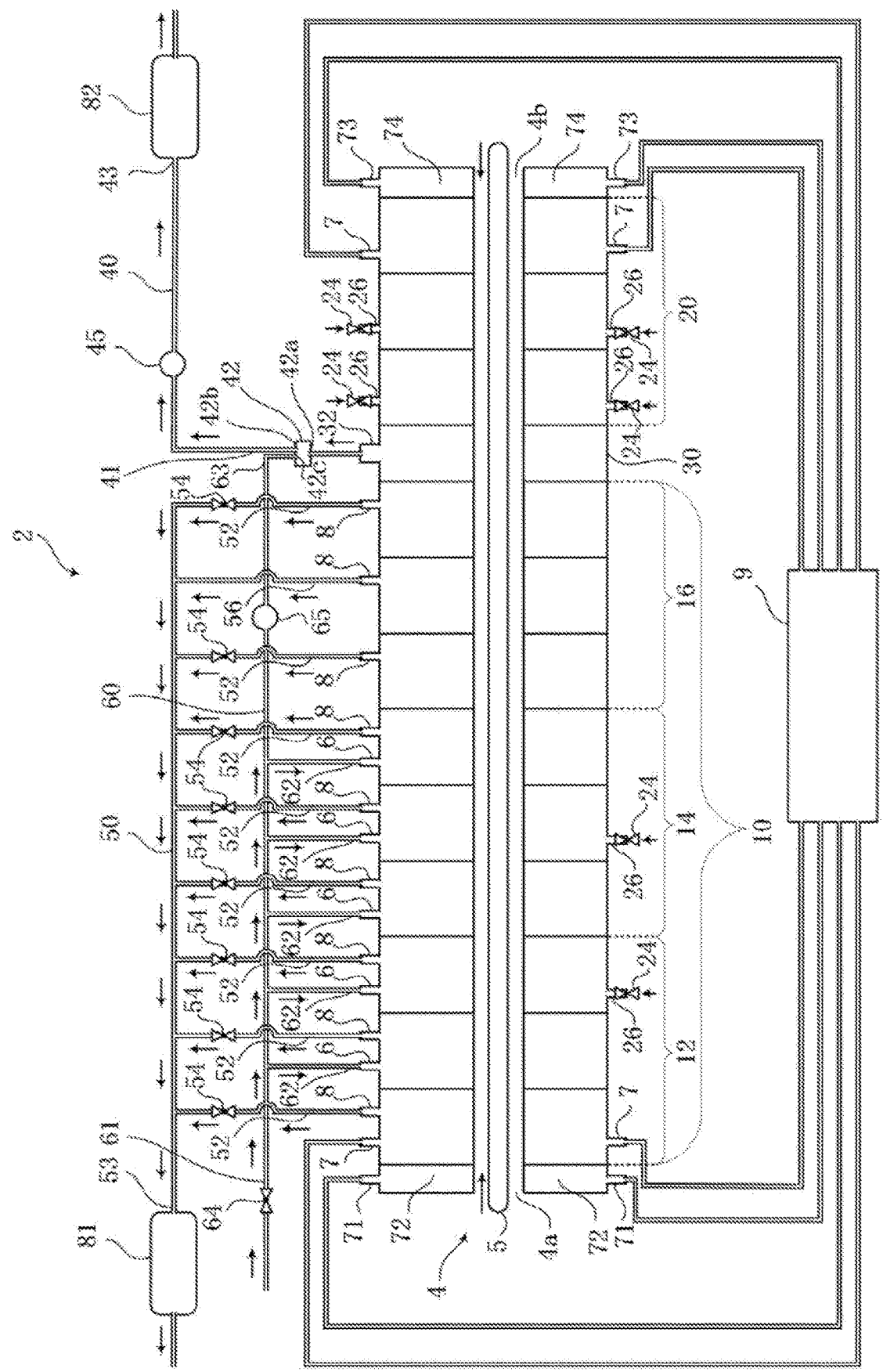
FIG. 2 is a schematic diagram for the flowing directions of gas entering and discharged from the reflow oven shown in FIG. 1A in air mode.
Figure 3:
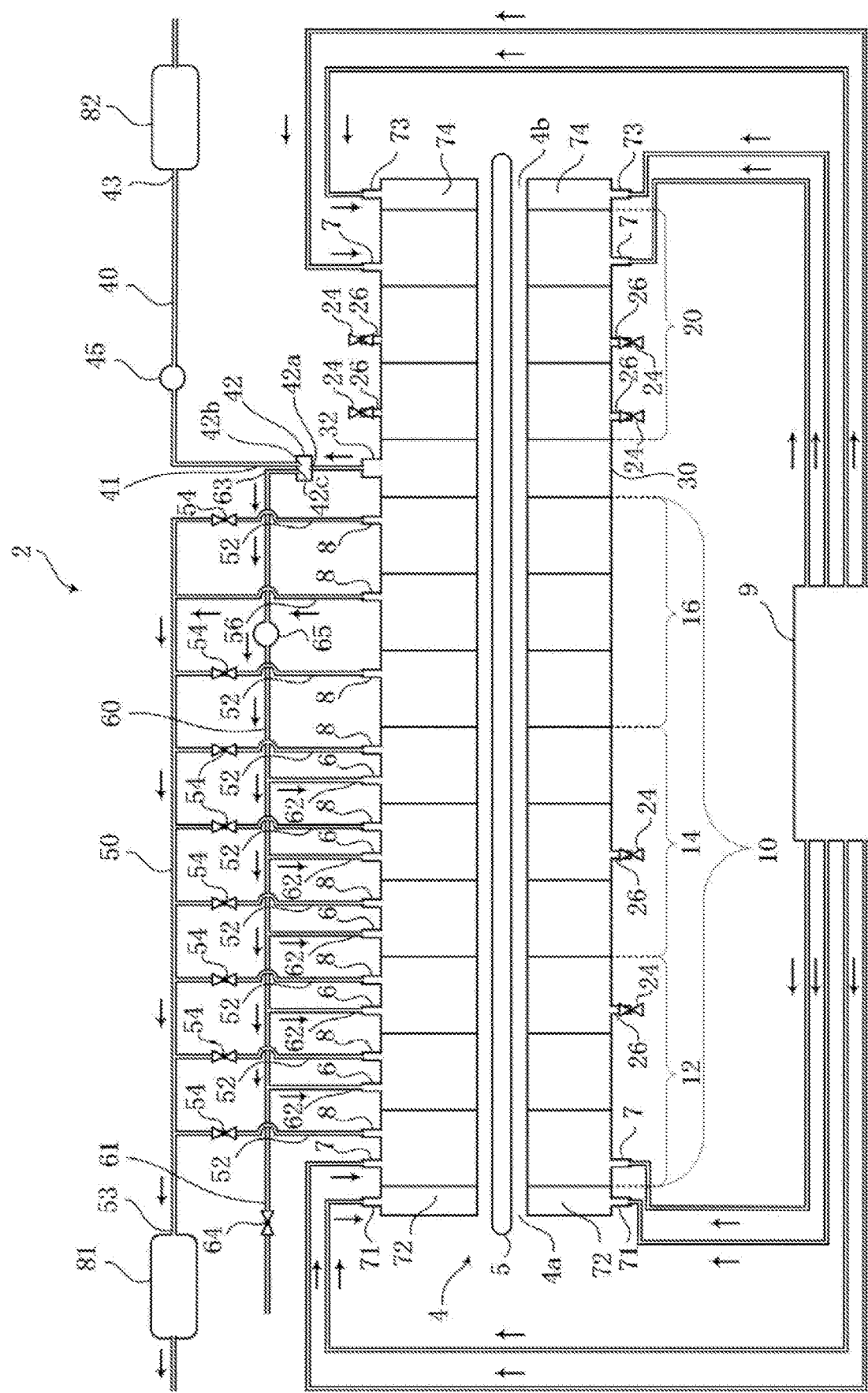
FIG. 3 is a schematic diagram for the flowing directions of gas entering and discharged from the reflow oven shown in FIG. 1A in inert gas mode.

FIG. 2 and FIG. 3 respectively show the flowing directions of gas entering and discharged from the reflow oven 2 shown in FIG. 1A in air mode and in inert gas (nitrogen) mode, wherein the arrows represent the flowing directions of gas flows.

As shown in FIG. 2, the reflow oven 2 operates in air mode. In this case, the first valve gear 42 of the reflow oven 2 connects the inlet 41 of the first pipeline 40 with the blocked exhaust zone outlet 32, but disconnects the second inlet 63 of the third pipeline 60 from the blocked exhaust zone outlet 32. Each second valve gear 54 is opened and the third valve gear 64 is also opened. In addition, each auxiliary inlet control valve 24 opens the corresponding the auxiliary inlet 26. Thus, when the reflow oven operates in air mode, the first pipeline 40 and the second pipeline 50 can discharge gas from the reflow oven 2, and the third pipeline 60 can transfer clean air to the reflow oven 2. External clean air can enter the reflow oven 2 from the chamber inlet 4*a* and the chamber outlet 4*b* under the action of the pressure in the chamber 4. In addition, external clean air can also enter the reflow oven 2 from the auxiliary inlets 26.

As shown in FIG. 2, since a plurality of sub-zones of the heating zone 10 transfer hot vapors containing volatile pollutants to the second pipeline 50 and the first pipeline 40 discharges gas from the blocked exhaust zone 30 under the action of the first accelerator 45, hot gas containing volatile pollutants in the reflow oven 2 can be discharged more quickly so that hot gas containing volatile pollutants can be prevented from excessively residing in the heating zone 10 or entering the cooling zone 20. External clean air can not only enter the reflow oven 2 from the chamber inlet 4a and the chamber outlet 4b, but also enter the preheating sub-zones 12, uniform-temperature sub-zones 14 and cooling zone 20 of the reflow oven 2 from the third pipeline 60 and the auxiliary inlets 26. Therefore, the supply of clean air to the reflow oven 2 can be sped up, with the accurate temperature profiling in the reflow oven 2 not affected. By speeding up the supply of clean air to the reflow oven 2 and the discharging of hot gas containing volatile pollutants from the reflow oven 2, the gas circulation in the reflow oven 2 can be accelerated and the gas in the reflow oven 2 can be kept cleaner. In addition, discharging gas from the blocked exhaust zone 30 between the heating zone 10 and the cooling zone 20 through the first pipeline 40 can block hot gas containing volatile pollutants in the heating zone 10 from entering the cooling zone 20.

As shown in FIG. 3, the reflow oven 2 operates in nitrogen mode. In this case, the first valve gear 42 of the reflow oven 2 connects the second inlet 63 of the third pipeline 60 with the blocked exhaust zone outlet 32, but disconnects the inlet 41 of the first pipeline 40 from the blocked exhaust zone outlet 32. Each second valve gear 54 is closed and the third valve gear 64 is also closed. In addition, each auxiliary inlet control valve 24 closes the corresponding the auxiliary inlet 26. The nitrogen supply source 9 is opened to supply clean nitrogen to the reflow oven 2. Thus, when the reflow oven 2 operates in nitrogen mode, the nitrogen supply source 9 supplies clean nitrogen to the reflow oven 2, the third pipeline 60 is used to transfer the gas discharged from the blocked exhaust zone 30 to the preheating sub-zones 12 and uniform-temperature zones 14 of the reflow oven 2, and the second pipeline 50 can discharge gas from the peak-value sub-zones 16.

Discharging gas from the blocked exhaust zone 30 can block the hot gas containing volatile pollutants in the heating zone 10 from entering the cooling zone 20. Some of the gas discharged from the blocked exhaust zone 30 comes from the hot gas containing volatile pollutants in the heating zone 10, and the rest comes from the clean nitrogen in the cooling zone 20. Therefore, the gas discharged from the blocked exhaust zone 30 has a high nitrogen content and is cleaner than the gas in the heating zone 10. By transferring the gas discharged from the blocked exhaust zone 30 through the third pipeline 60 back to the preheating sub-zones 12 and uniform-temperature sub-zones 14 of the reflow oven 2, nitrogen can be fully utilized, with the accurate temperature profiling in the reflow oven 2 not affected.

The reflow oven 2 in the present application further comprises a control device (not shown) and the control device sends a corresponding control signal according to the selected operation mode (air mode or inert gas mode) to control the opening/closing of the second valve gear 54, the third valve gear 64 and auxiliary inlet control valves 24, control the connection/disconnection of the inlet 42a of the first valve gear 42 with/from the first outlet 42b and the second outlet 42c, and control the opening/closing of the nitrogen supply source 9.

It should be noted that when the reflow oven 2 in the present application is used in a factory, the first pipeline 40 and the second pipeline 50 can be connected to the exhaust system of the factory. The exhaust system of the factory can be an air purge unit, for example, a fan, and is used to discharge gas from the reflow oven 2 at a certain discharge speed according to the operation parameters of the reflow oven 2. Of course, a separate air purge unit can be arranged on the first pipeline 40 and the second pipeline 50. They all fall within the scope of protection of the present application. In addition, the first pipeline 40 and the second pipeline 50 can directly be connected to the exhaust system of the factory, instead of a filtering device, and volatile pollutants are filtered out by the filtering device in the exhaust system of the factory.

The operation method of the embodiment shown in FIG. 1B is similar to that in FIG. 1A, and the difference is that in nitrogen mode of the embodiment shown in FIG. 1B, the second valve gear 54 on the outlet branch pipeline 56 connected to the heating zone outlet 8 of the middle peak-value sub-zone 16 connects the outlet branch pipeline 56 with the heating zone outlet 8 of the middle peak-value sub-zone 16, and the second valve gears 54 on the other outlet branch pipelines 52 disconnect these outlet branch pipelines 52 with the corresponding heating zone outlets 8. Thus, in nitrogen mode, the heating zone outlet 8 of the middle peak-value sub-zone 16 transfers gas through the outlet branch pipeline 56 to the second pipeline 50 and discharges gas through the second pipeline 50 to the ambient environment.

It should be noted that although the second pipeline 50 is equipped with outlet branch pipelines 52, 56 which can connect with each sub-zone of the heating zone in the abovementioned embodiment, the second pipeline 50 can also be equipped with outlet branch pipelines 52, 56 which can connect with only some of the sub-zones of the heating zone in other embodiments of the present application. Although the second pipeline 50 discharges gas only through one outlet branch pipeline 56 in nitrogen mode in the abovementioned embodiment, the second pipeline 50 can also discharge gas through more than one outlet branch pipeline 56, as long as gas is discharged from the peak-value sub-zones 16, in other embodiments of the present application. In addition, although the third pipeline 60 transfers gas to two preheating sub-zones 12 and three uniform-temperature sub-zones 14 in the abovementioned embodiment, the third pipeline 60 can also transfer gas all the three preheating-sub-zones 12 and all the three uniform-temperature sub-zones 14, or can transfer gas to some of the three preheating sub-zones 12 and the three uniform-temperature sub-zones 14 in other embodiments of the present application.

Through the improvements of gas intake and gas discharging of the reflow oven in the present application, only one reflow oven can realize the effective discharging of volatile pollutants from the reflow oven in air mode or inert gas mode, with the accurate temperature profiling necessary for reflow processing satisfied. By effectively discharging volatile pollutants from the reflow oven, the number of follow-up services and maintenances can be reduced. In addition, the reflow oven in the present application also fully utilizes inert gases so that it is more cost effective to use inert gases and expensive inert gases are saved.

In addition, it should be noted that although the reflow oven in the abovementioned embodiment can operate not only in air mode, but also in inert gas mode, the reflow oven in the present application can also serve as a reflow oven operating only in air mode, or as a reflow oven operating only in inert gas mode, only by controlling the control valves accordingly.

The present application is disclosed by use of examples, one or more of which are illustrated in the drawings. Each example is provided to explain the present application, but not to restrict the present application. In fact, it is obvious to those skilled in the art that various modifications and variations can be made to the present application, without departing from the scope or spirit of the present application. For example, the illustrated or described characteristics as a part of one embodiment can be used together with another embodiment to obtain a further embodiment. Therefore, the intention is to make modifications and variations within the scope of the attached claims and the equivalents of the present application.

What is claimed is:

1. A reflow oven, said reflow oven being able to operate in air mode and in inert gas mode, and said reflow oven comprising:
    a heating zone, said heating zone having a plurality of heating zone inlets and a plurality of heating zone outlets,
    a cooling zone,
    a blocked exhaust zone, said blocked exhaust zone being located between said heating zone and said cooling zone, and said heating zone, said blocked exhaust zone and said cooling zone being fluid-connected, wherein said blocked exhaust zone has a blocked exhaust zone outlet,
    a first pipeline, said first pipeline being controllably connected to said blocked exhaust zone outlet and said first pipeline being configured to direct exhaust to an ambient environment,
    a second pipeline and a plurality of outlet branch pipelines, said second pipeline being configured to direct exhaust to the ambient environment, said second pipeline being controllably connected to said plurality of outlet branch pipelines, said plurality of outlet branch pipelines controllably connected to said plurality of heating zone outlets and said second pipeline, and
    a third pipeline and a plurality of inlet branch pipelines, said third pipeline being connected to said plurality of inlet branch pipelines, said plurality of inlet branch pipelines being connected to said plurality of heating zone inlets and said third pipeline, said third pipeline being controllably connected to said blocked exhaust zone outlet and said third pipeline being controllably connected to the ambient environment so that said plurality of inlet branch pipelines controllably connect said plurality of heating zone inlets to the ambient environment, and in addition, said plurality of inlet branch pipelines controllably connect said plurality of heating zone inlets and said blocked exhaust zone outlet.

2. The reflow oven as claimed in claim 1, wherein:
    at least one outlet branch pipeline of said plurality of outlet branch pipelines directly connects at least one heating zone outlet of said plurality of heating zone outlets and said second pipeline, and the other outlet branch pipelines of said plurality of outlet branch pipelines controllably connect the corresponding heating zone outlets of said plurality of heating zone outlets and said second pipeline.

3. The reflow oven as claimed in claim 2, wherein:
    said first pipeline and said third pipeline are controllably connected to said blocked exhaust zone outlet through a first valve gear,
    the other outlet branch pipelines, of said plurality of outlet branch pipelines controllably connect the corresponding heating zone outlets of said plurality of heating zone outlets and said second pipeline through second valve gears, respectively, and
    said third pipeline is controllably connected to the ambient environment through a third valve gear,
    wherein, in said air mode,
    said first valve gear connects said first pipeline and said blocked exhaust zone outlet and disconnects said third pipeline from said blocked exhaust zone outlet so that the gas in said blocked exhaust zone can be discharged to the ambient environment through said first pipeline,
    said second valve gears connect the other outlet branch pipelines of said plurality of outlet branch pipelines and the corresponding heating zone outlets of said plurality of heating zone outlets so that the gas in said heating zone can enter said second pipeline and be discharged to the ambient environment through said plurality of outlet branch pipelines, and
    said third valve gear connects said third pipeline to the ambient environment so that external clean air can enter said heating zone through said third pipeline,
    and in the inert gas mode,
    said first valve gear disconnects said first pipeline from said blocked exhaust zone outlet and connects said third pipeline and said blocked exhaust zone outlet so that the gas in said blocked exhaust zone can enter said third pipeline,
    said second valve gears disconnect the other outlet branch pipelines of said plurality of outlet branch pipelines from the corresponding heating zone outlets of said plurality of heating zone outlets so that the gas in said heating zone can enter said second pipeline and be discharged from said second pipeline to the ambient environment through said at least one outlet branch pipeline directly connecting said at least one heating zone outlet of said plurality of heating zone outlets and said second pipeline, and
    said third valve gear disconnects said third pipeline from the ambient environment so that the gas entering said third pipeline from said blocked exhaust zone can enter said heating zone.

4. The reflow oven as claimed in claim 3, wherein:
    said first valve gear comprises an inlet, a first outlet and a second outlet, wherein said inlet is connected to said blocked exhaust zone outlet, said first outlet is connected to said first pipeline, and said second outlet is connected to said third pipeline so that the connections with or disconnections from said first pipeline and said third pipeline said blocked exhaust zone outlet can be controlled by controlling the connection of said inlet with or disconnection of said inlet from said first outlet and the connection of said inlet with or disconnection of said inlet from said second outlet.

5. The reflow oven as claimed in claim 1, wherein:
    all outlet branch pipelines of said plurality of outlet branch pipelines controllably connect said plurality of heating zone outlets and said second pipeline.

6. The reflow oven as claimed in claim 5, wherein:
    said heating zone comprises at least one preheating sub-zone, at least one uniform-temperature sub-zone and at least one peak-value sub-zone, wherein said plurality of heating zone outlets are arranged in said at least one preheating sub-zone, said at least one uniform-temperature sub-zone and said at least one peak-value sub-zone, and in addition, the gas in said heating zone enters said second pipeline and is discharged from said second pipeline to the ambient environment through the heating zone outlets arranged in said at least one peak-value sub-zone in said inert gas mode.

7. The reflow oven as claimed in claim 1, wherein:
said first pipeline and said third pipeline are controllably connected to said blocked exhaust zone outlet through a first valve gear,
some or all outlet branch pipelines of said plurality of outlet branch pipelines controllably connect said plurality of heating zone outlets and said second pipeline through second valve gears, respectively, and
said third pipeline is controllably connected to the ambient environment through a third valve gear.

8. The reflow oven as claimed in claim 7, wherein:
said first pipeline and said third pipeline are controllably connected to said blocked exhaust zone outlet through said first valve gear,
all outlet branch pipelines of said plurality of outlet branch pipelines controllably connect said plurality of heating zone outlets and said second pipeline through said second valve gears, respectively, and
said third pipeline is controllably connected to the ambient environment through said third valve gear,
wherein, in said air mode,
said first valve gear connects said first pipeline and said blocked exhaust zone outlet and disconnects said third pipeline from said blocked exhaust zone outlet so that the gas in said blocked exhaust zone can be discharged to the ambient environment through said first pipeline,
said second valve gears connect all outlet branch pipelines of said plurality of outlet branch pipelines and said plurality of heating zone outlets so that the gas in said heating zone can enter said second pipeline and be discharged to the ambient environment through said plurality of outlet branch pipelines, and
said third valve gear connects said third pipeline to the ambient environment so that external clean air can enter said heating zone through said third pipeline,
and in the inert gas mode,
said first valve gear disconnects said first pipeline from said blocked exhaust zone outlet and connects said third pipeline and said blocked exhaust zone outlet so that the gas in said blocked exhaust zone can enter said third pipeline,
said second valve gears connect at least one outlet branch pipeline of said plurality of outlet branch pipelines and a corresponding heating zone outlet of said plurality of heating zone outlets and disconnects the other outlet branch pipelines of said plurality of outlet branch pipelines from the corresponding heating zone outlet of said plurality of heating zone outlets so that the gas in said heating zone can enter said second pipeline and be discharged from said second pipeline to the ambient environment through said at least one outlet branch pipeline, and
said third valve gear disconnects said third pipeline from the ambient environment so that the gas entering said third pipeline from said blocked exhaust zone can enter said heating zone.

9. The reflow oven as claimed in claim 8, wherein:
said heating zone comprises at least one preheating sub-zone, at least one uniform-temperature sub-zone and at least one peak-value sub-zone, wherein said plurality of heating zone inlets are arranged in said at least one preheating sub-zone and said at least one uniform-temperature sub-zone so that the gas entering said third pipeline can enter said at least one preheating sub-zone and said at least one uniform-temperature sub-zone.

10. The reflow oven as claimed in claim 1, wherein:
a first gas accelerator and a second gas accelerator are arranged on said first pipeline and said third pipeline, respectively,
wherein, said first gas accelerator and said second gas accelerator are arranged near said blocked exhaust zone to accelerate gas discharging from said blocked exhaust zone.

11. The reflow oven as claimed in claim 1, wherein some or all outlet branch pipes of said plurality of outlet branch pipelines controllably connect said plurality of heating zone outlets and said second pipeline.

* * * * *